(12) United States Patent
Nichols

(10) Patent No.: US 8,345,426 B2
(45) Date of Patent: Jan. 1, 2013

(54) GUIDE SYSTEM FOR A CARD MODULE

(75) Inventor: Robert Paul Nichols, Santa Rosa, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 207 days.

(21) Appl. No.: 12/857,127

(22) Filed: Aug. 16, 2010

(65) Prior Publication Data

US 2012/0039047 A1    Feb. 16, 2012

(51) Int. Cl.
*H05K 7/20*    (2006.01)
*H05K 7/14*    (2006.01)

(52) U.S. Cl. ........ 361/715; 361/709; 361/716; 361/756; 361/788; 361/796; 361/802; 165/80.2

(58) Field of Classification Search .................. 361/704, 361/715, 709, 710, 711, 716, 756, 788, 796, 361/802; 165/80.2–80.3, 185
See application file for complete search history.

(56) References Cited

U.S. PATENT DOCUMENTS

| 4,756,081 | A | * | 7/1988 | Penn ............................... 29/832 |
| 5,019,939 | A | * | 5/1991 | Reimer ......................... 361/721 |
| 5,506,751 | A | * | 4/1996 | Chatel ........................... 361/690 |
| 5,966,289 | A | * | 10/1999 | Hastings et al. .............. 361/704 |
| 6,816,376 | B2 | | 11/2004 | Bright et al. |
| 7,048,452 | B2 | | 5/2006 | Malagrino, Jr. |
| 7,239,515 | B2 | * | 7/2007 | Bulman-Fleming et al. . 361/704 |
| 7,277,296 | B2 | * | 10/2007 | Ice ................................. 361/756 |
| 7,342,794 | B1 | * | 3/2008 | Mease et al. .................. 361/710 |
| 7,625,223 | B1 | | 12/2009 | Fogg |
| 8,059,409 | B2 | * | 11/2011 | Steenwyk et al. ............ 361/710 |
| 2004/0060688 | A1 | * | 4/2004 | Delano ........................ 165/80.3 |

* cited by examiner

*Primary Examiner* — Zachary M Pape

(57) ABSTRACT

A guide system is provided for an electronic device having a card module mated with a header. The guide system includes a guide rail configured to guide the card module for mating with the header of the electronic device. The guide rail includes a main wall extending along a longitudinal axis between a front end and a rear end positioned proximate to the header. The guide rail also includes board guides extending from the main wall along the longitudinal axis that are configured to engage a card module circuit board or board guide of the card module to guide the card module to the header. The guide rail also includes heat sink flanges extending from the main wall along the longitudinal axis that are configured to engage a heat sink of the card module to dissipate heat from the heat sink to the main wall.

21 Claims, 4 Drawing Sheets

GUIDE SYSTEM FOR A CARD MODULE

BACKGROUND OF THE INVENTION

The subject matter herein relates generally to electronic devices, and more particularly, to a guide system for a card module.

Electronic devices generally include connectors to receive input and output (I/O) devices, such as card modules. The card modules are configured to transmit and receive data and/or power signals from external devices. The card modules typically include a front connector that extends from a front face of the electronic device that connects to the external device. The front connector may be a fiber optic based connection, a copper based connection or another type of connection. A back connector of the card module is configured to engage an electrical connector, referred to as a header, mounted on a circuit board of the electronic device. Accordingly, the external device communicates with the electronic device through the card module. Conventional electronic devices include a guide system for guiding the card modules to the header.

Known electronic devices are not without disadvantages. For example, as data rates increase, the electronic components of the card modules generate additional heat. Heat dissipation from card modules within electronic devices may be complex and include multiple thermal interfaces. For example, some known electronic devices utilize a cage that surrounds the cavity in which the card module is loaded. The cage engages a heat sink of the card module to dissipate heat from the card module. The cage is then connected to a separate heat sink to dissipate heat from the cage. Having multiple thermal interfaces provides an inefficient heat dissipation system. Additionally, the guide system may block access to portions of the card module, reducing the effectiveness of the cage.

A need remains for an electronic device that provides heat dissipation from a card module. A need remains for an electronic device that interfaces with a heat sink in an efficient manner.

BRIEF DESCRIPTION OF THE INVENTION

In one embodiment, an electronic device is provided having a card module having a card module circuit board having a front end connector at a front end of the card module circuit board and a rear end connector at the rear end of the card module circuit board. The rear end connector is configured to be mated to the header. The card module also includes electronic components mounted to the card module circuit board and a heat sink dissipating heat from the electronic components. The electronic device also includes a guide rail guiding the card module for mating with the header. The guide rail includes a main wall extending along a longitudinal axis between a front end and a rear end positioned proximate to a header. The guide rail includes board guides extending from the main wall along the longitudinal axis that engage the card module to guide the rear end connector to the header. The guide rail also includes heat sink flanges extending from the main wall along the longitudinal axis that engage the heat sink of the card module to dissipate heat from the heat sink to the main wall.

In another embodiment, a guide system is provided for an electronic device having a card module mated with a header. The guide system includes a guide rail configured to guide the card module for mating with the header of the electronic device. The guide rail includes a main wall extending along a longitudinal axis between a front end and a rear end positioned proximate to the header. The guide rail also includes board guides extending from the main wall along the longitudinal axis that are configured to engage a card module circuit board or board guide of the card module to guide the card module to the header. The guide rail also includes heat sink flanges extending from the main wall along the longitudinal axis that are configured to engage a heat sink of the card module to dissipate heat from the heat sink to the main wall.

In yet another embodiment, a guide system is provided including a guide rail configured to guide multiple card modules for mating with corresponding headers of an electronic device. The guide rail includes a main wall extending along a longitudinal axis between a front end and a rear end positioned proximate to the header. The main well has a first side and a second side. Board guides extend from the first and second sides of the main wall parallel to the longitudinal axis that engage corresponding card modules to guide the card modules to the corresponding headers. Heat sink flanges extend from the first and second sides of the main wall parallel to the longitudinal axis to engage heat sinks of the corresponding card modules to dissipate heat from the heat sinks to the main wall.

In a further embodiment, an electronic device is provided including a housing having a bezel with an opening therethrough and a circuit board held in the housing spaced apart from the bezel that has a header mounted thereto. A card module is received in the housing through the opening. The card module includes a card module circuit board spanning between the bezel and the circuit board that has a front end connector at a front end of the card module circuit board and a rear end connector at the rear end of the card module circuit board. The front end connector is exposed at the bezel for mating with a mating connector and the rear end connector is mated to the header. The card module also includes electronic components mounted to the card module circuit board and a heat sink dissipating heat from the electronic components. A guide rail guides the card module for mating with the header. The guide rail includes a main wall extending along a longitudinal axis between a front end and a rear end with the front end engaging the bezel and the rear end positioned proximate to the header. The guide rail includes board guides extending from the main wall along the longitudinal axis that engage the card module to guide the rear end connector to the header. The guide rail also includes heat sink flanges extending from the main wall along the longitudinal axis that engage the heat sink of the card module to dissipate heat from the heat sink to the main wall.

DETAILED DESCRIPTION OF THE INVENTION

Figure 1:
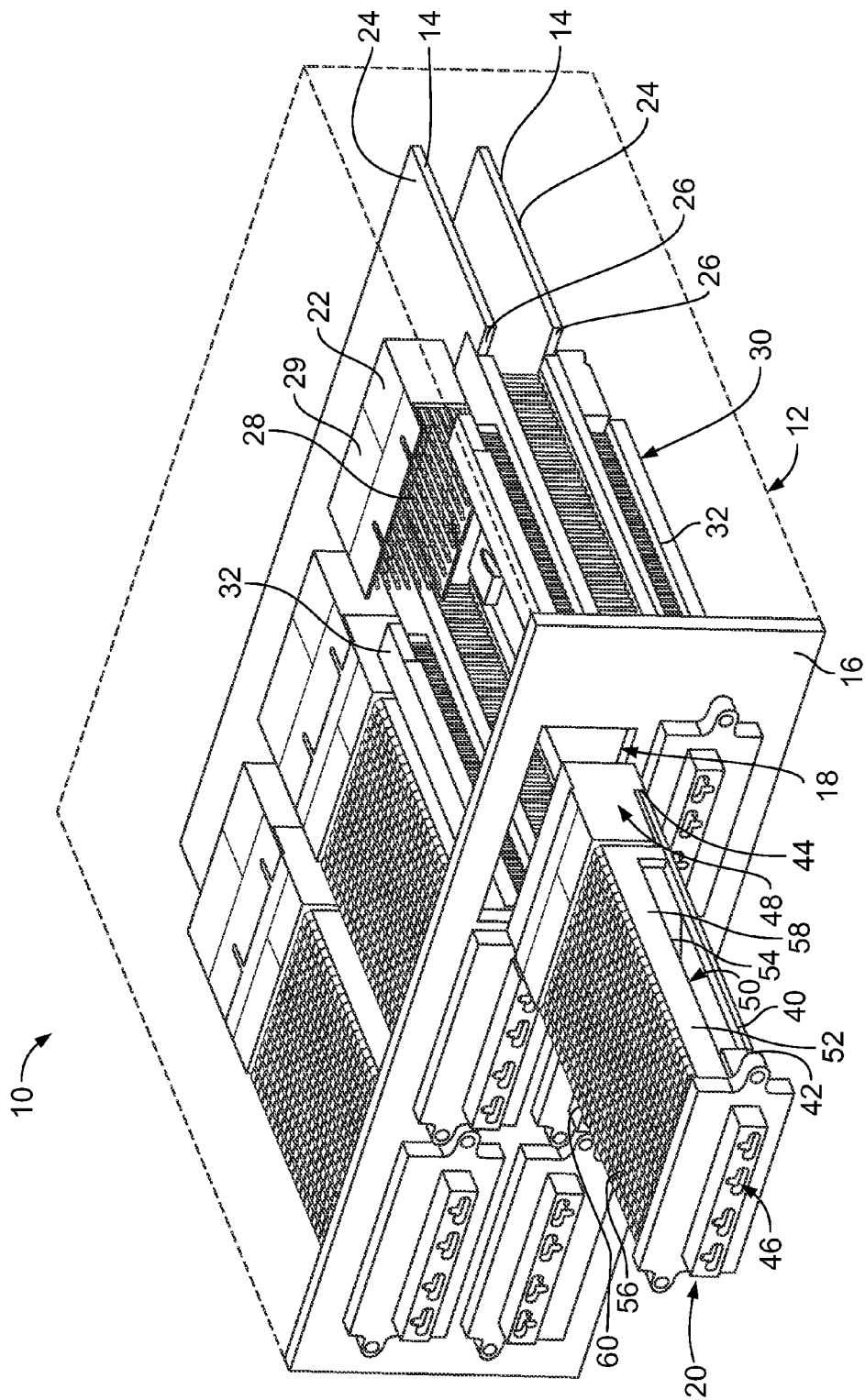
FIG. 1 illustrates a portion of an electronic device formed in accordance with an exemplary embodiment.

FIG. 1 illustrates a portion of an electronic device 10 formed in accordance with an exemplary embodiment. The electronic device 10 includes a housing 12, which is shown in phantom. One or more host circuit boards 14 are provided within the housing 12. In the illustrated embodiment, two host circuit boards 14 are shown, which are separated by a gap. Air is able to flow in the gap between the host circuit boards 14 to cool the components within the housing 12.

The housing 12 includes a front panel or bezel 16 at a front thereof. The bezel 16 includes a plurality of openings 18 therethrough that provide access to the host circuit boards 14. Any number of openings 18 may be provided depending on the particular application and density of the electronic device 10. In the illustrated embodiment, the openings 18 are provided in two rows, an upper row and a lower row. Any number of rows may be provided. Each row includes multiple openings 18.

Input/output (I/O) devices in the form of card modules 20 are received through the openings 18 and coupled to the host circuit board 14. Other types of I/O devices may be used in alternative embodiments. The card modules 20 are configured to transmit and receive data and/or power signals from external devices. Each card modules 20 provide one or more interfaces for external devices. For example, each card module 20 may include one or more transceivers for mating with an external connector (not shown).

Within the housing 12, the host circuit boards 14 are held spaced apart from the bezel 16. Each host circuit board 14 includes a plurality of headers 22 mounted thereto. The card modules 20 are mated to corresponding headers 22. Any number of headers 22 may be provided on the host circuit boards 14. Each card module 20 may be coupled to one or more headers 22. In the illustrated embodiment, the headers 22 constitute right angle connectors mounted to a mounting surface 24 of the corresponding host circuit board 14. Optionally, the headers 22 may be mounted above the upper host circuit board 14 and mounted below the lower host circuit board 14. The headers 22 are provided at a front edge 26 of the host circuit board 14. Optionally, at least a portion of each header 22 extends forward from the front edge 26.

The headers 22 include a plurality of contacts 28 held within a corresponding header housing 29. The contacts 28 are electrically connected to the circuit board 14. The card modules 20 are electrically connected to the header contacts 28 when mated to the headers 22.

The electronic device 10 includes a guide system 30 extending between the bezel 16 and the host circuit boards 14. The guide system 30 supports the bezel 16 and/or the host circuit boards 14. The guide system 30 includes a plurality of guide rails 32 that span across an air gap provided between the front edges 26 of the host circuit boards 14 and the bezel 16. The guide rails 32 guide the card modules 20 during loading and unloading of the card modules 20 into the housing 12. The guide rails 32 guide the card modules 20 for mating with the headers 22.

The card module 20 includes a card module circuit board 40 extending between a front end 42 and a rear end 44. A front end connector 46 is provided at the front end 42. A rear end connector 48 is provided at the rear end 44. The front and rear end connectors 46, 48 are mounted to the card module circuit board 40 and are electrically connected to the card module circuit board 40. Data and/or power signals are transmitted between the front and rear end connectors 46, 48 via the card module circuit board 40.

The front end connector 46 is configured to be mated with one or more external connectors, such as cable connectors. The external connectors may be fiber optic connectors, copper based connectors or other types of connectors. As such, the front end connector 46 may constitute a fiber optic transceiver, a copper based transceiver or another type of transceiver or connector that receives the external connector.

The rear end connector 48 is mated to the header 22 when the card module 20 is loaded into the housing 12. The rear end connector 48 has an interface that is complementary to the interface of the header 22. In the illustrated embodiment, the rear end connector 48 constitutes a right angle connector. In one exemplary embodiment, the rear end connector 48 constitutes a high-speed connector, such as a Z-PACK TinMan® connector, commercially available from Tyco Electronics. Other types of connectors may be utilized in alternative embodiments for mating with the header 22.

The card module 20 includes a plurality of electronic components 50 mounted to the card module circuit board 40. The data and/or power signals are transmitted between the front and rear end connectors 46, 48 via the electronic components 50. Optionally, the electronic components 50 may transform the signals between the front end connector 46 and the rear end connector 48. For example, the electronic components 50 may transform the signals between a fiber optic type signal and a copper based signal.

The card module 20 includes a heat sink 52 mounted to the card module circuit board 40. The heat sink 52 dissipates heat generated by the electronic components 50 and/or the front and rear end connectors 46, 48. The heat sink 52 includes a base 54 in thermal contact with the electronic components 50. Optionally, a thermal grease or other thermal interface may be provided between the electronic components 50 and the heat sink 52. The heat sink 52 includes fins 56 extending from the base 54. The fins 56 help to dissipate the heat from the heat sink 52. The heat sink 52 includes opposite sides 58, 60 extending longitudinally along the heat sink 52.

The card module 20 is loaded into the guide system 30 such that the heat sink 52 engages the guide rails 32. For example, the sides 58, 60 may engage the guide rails 32 to define a direct thermal pathway between the heat sink 52 and the guide rail 32. A thermal interface is provided between the heat sink 52 and the guide rails 32. Heat is transferred from the heat sink 52 into the guide rails 32, and the guide rails 32 help to dissipate heat from the heat sink 52.

Figure 2:
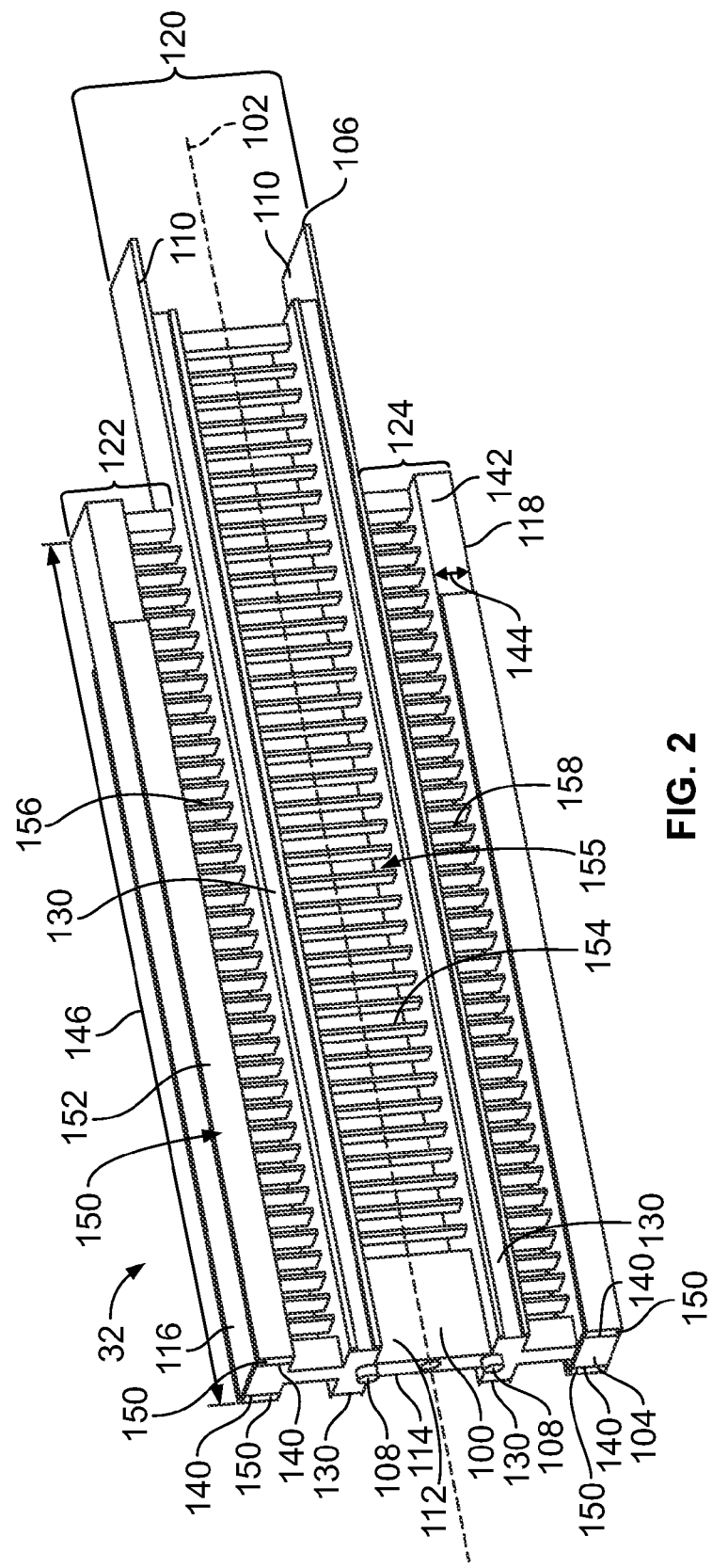
FIG. 2 is a side perspective view of a guide rail for the electronic device formed in accordance with an exemplary embodiment.
Figure 3:
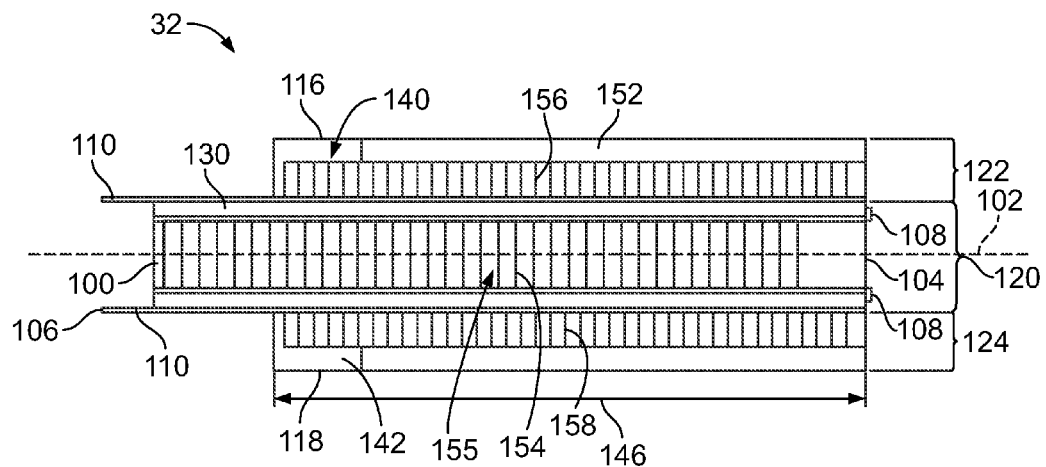
FIG. 3 is a side view of the guide rail shown in FIG. 2.
Figure 4:
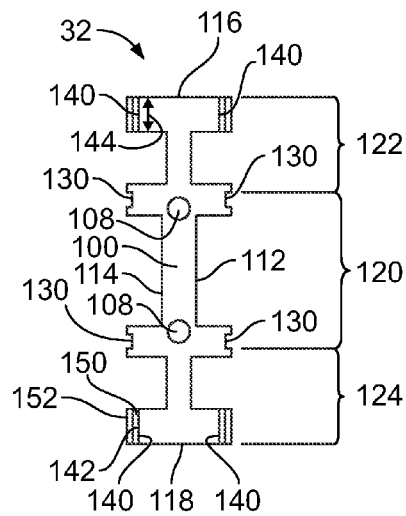
FIG. 4 is a front view of the guide rail shown in FIG. 2.

FIG. 2 is a side perspective view of one of the guide rails 32 formed in accordance with an exemplary embodiment. FIG. 3 is a side view of the guide rail 32. FIG. 4 is a front view of the guide rail 32.

The guide rail 32 includes a main wall 100 extending along a longitudinal axis 102 between a front end 104 and a rear end 106. The front end engages the bezel 16 and is configured to be positioned adjacent the openings 18 (both shown in FIG. 1). Posts 108 extend from the front end 104 for engaging the bezel 16. The posts 108 position the guide rail 32 with respect to the bezel 16. The rear end 106 engages the host circuit boards 14 (shown in FIG. 1). Shoulders 110 are provided at the rear end 106 for engaging the host circuit boards 14 or features extending from the host circuit boards 14. Optionally, two shoulders 110 are provided, which engage the upper and lower host circuit boards 14. The shoulders 110 may hold the two host circuit boards 14 in position relative to one another, such as at a predetermined spacing from one another.

The main wall 100 includes a first side 112 and a second side 114 opposite the first side 112. In an exemplary embodiment, the guide rail 32 is configured to hold card modules 20 (shown in FIG. 1) on both sides 112, 114 thereof. The guide rail 32 thus supports multiple card modules 20.

The main wall 100 includes a top end 116 and a bottom end 118 opposite the top end 116. The main wall 100 includes a central section 120 with an upper section 122 above the central section 120 between the central section 120 and the top end 116 and a lower section 124 below the central section 120 between the central section 120 and the bottom end 118.

In an exemplary embodiment, the guide rail 32 is configured to hold card modules 20 (shown in FIG. 1) at both the upper section 122 and the lower section 124 thereof. The guide rail 32 thus supports multiple card modules 20.

The guide rail 32 includes a plurality of board guides 130 extending from the main wall 100 parallel to the longitudinal axis 102. The board guides 130 engage the card module 20 to guide the card module 20 into the housing 12. The board guides 130 may engage the card module circuit board 40 (shown in FIG. 1). Alternatively, the board guides 130 may engage complementary board guides or other features extending from the card module circuit board 40. The board guides 130 may engage other parts of the card module 20 to guide the card module 20 into the housing 12. The number of board guides 130 corresponds to the number of card modules 20 that are configured to be guided by the guide rail 32. In the illustrated embodiment, the guide rail 32 includes four board guides 130. Two board guides 130 extend from the first side 112. Two board guides 130 extend from the second side 114. One of the board guides 130 extending from the first side 112 extends from the main wall 100 generally at the intersection between the central section 120 and the upper section 122. The other board guide 130 extending from the first side 112 extends from the main wall 100 generally at the intersection between the central section 120 and the lower section 124. Similarly, the board guides 130 extending from second side 114 extend from the main wall 100 generally at the intersections between the central section 120 and the upper and lower sections 122, 124, respectively. The guide rail 32 thus guides card modules 20 along both the top and bottom of the guide rail 32 and along both sides 112, 114 of the guide rail 32.

In an exemplary embodiment, each board guide 130 constitutes a track configured to receive the card module circuit board 40 (shown in FIG. 1). The track holds the card module circuit board 40 slidably in position with respect to the guide rail 32. For example, the track may hold a vertical position of the card module circuit board 40. The track may hold a horizontal position (side to side) of the card module circuit board 40, such as to resist movement of the card module circuit board 40 in a direction toward or away from the guide rail 32. The card module circuit board 40 is able to slide longitudinally (e.g. front to back horizontal movement) within the track parallel to the longitudinal axis 102.

The guide rail 32 includes a plurality of heat sink flanges 140 extending from the main wall 100 parallel to the longitudinal axis 102. The heat sink flanges 140 engage the heat sink 52 (shown in FIG. 1) of the card module 20 to dissipate heat from the heat sink 52 to the main wall 100. The heat sink flanges 140 are integrally formed with the guide rail 32. The heat sink flanges 140 extend from the main wall 100 and are formed integral therewith such that heat can be dissipated directly from the heat sink flanges 140 to the main wall 100 without having a separate interface therebetween.

The number of heat sink flanges 140 may correspond with the number of card modules 20 that, are configured to be held by the guide rail 32. Optionally, the guide rail 32 may be configured to guide additional card modules 20 without having heat sink flanges 140 for the additional card modules 20. In the illustrated embodiment, the guide rail 32 includes four heat sink flanges 140. Two heat sink flanges 140 extend from the first side 112. Two heat sink flanges 140 extend from the second side 114. One or the heat sink flanges 140 extending from the first side 112 extends from the upper section 122. The other heat sink flange 140 extending from the first side 112 extends from the lower section 124. Similarly, the heat sink flanges 140 extending from second side 114 extend from the main wall 100 generally at the upper and lower sections 122, 124, respectively. The guide rail 32 thus engages card modules 20 along both the top and bottom of the guide rail 32 and along both sides 112, 114 of the guide rail 32.

The heat sink flanges 140 extend outward from the main wall 100 to an outer edge 142. The outer edge 142 is positioned for interfacing with the heat sink 52. The outer edge 142 has a height 144 and a longitudinal length 146 that correspond to a height and a length of the heat sink 52. Optionally, the length 146 may be longer than the heat sink 52 such that the outer edge 142 engages the front and/or rear end connectors 46, 48 (shown in FIG. 1).

In an exemplary embodiment, a thermal interface material (TIM) 150 is provided at the outer edge 142. The TIM 150 is configured to interface with the heat sink 52. The TIM 150 increases the thermal transfer efficiency between the surfaces of the heat sink flanges 140 and the heat sink 52. The TIM 150 fills the gaps between the thermal transfer surfaces of the heat sink flanges 140 and the heat sink 52. The TIM 150 may be a thermal paste, a thermal grease or another similar material. Optionally, a foil or cover 152 may be provided over the TIM 150 to protect the TIM 150 during, repeated loading and unloading of the card module 20. The foil 152 provides a thin metal surface between the heat sink 52 and the TIM 150.

The heat sink flanges 140 extend to the outer edges 142 such that the outer edge 142 is positioned a distance from the main wall 100. An air gap is defined between the heat sink flange 140 and the board guide 130. The air gap allows airflow between the card module 20 and the main wall 100.

The central section 120 includes a plurality of heat dissipating fins 154 for dissipating heat from the guide rail 32. The heat dissipating fins 154 may be defined by openings 155 through the central section 120 extending entirely through the main wall 100. Alternatively, the heat dissipating fins 154 may be fin elements that extend outward from the main wall 100 and that are spaced apart from one another such that air or another heat transfer fluid is able to flow past the heat dissipating fins 154.

In an exemplary embodiment, the upper section 122 and the lower section 124 may include heat dissipating fins 156, 158. The heat dissipating fins 156, 158 dissipate heat from the main wall 100. The heat dissipating fins 156, 158 are spaced apart from one another to allow air flow between and along the heat dissipating fins 156, 158. In the illustrated embodiment, the heat dissipating fins 156, 158 have a height that is shorter than a height of the heat dissipating fins 154. The heights of the heat dissipating fins 154, 156, 158 may be different in alternative embodiments.

Figure 5:
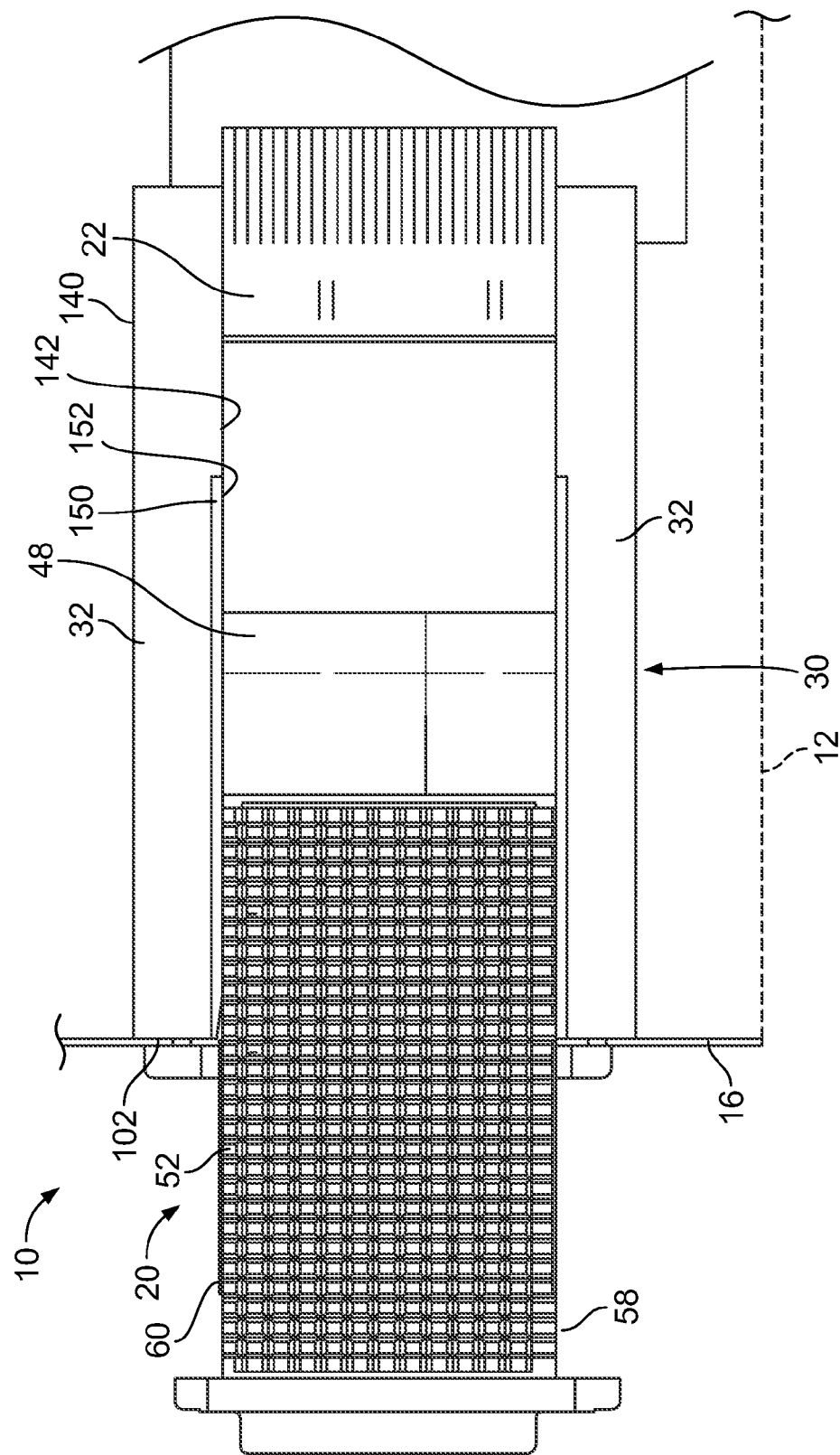
FIG. 5 illustrates a card module being loaded into the electronic device.

FIG. 5 is a top view of a portion of the electronic device 10 illustrating one of the card modules 20 being loaded into the housing 12. During loading; the card module 20 is loaded through the opening 18 (shown in FIG. 1) in the bezel 16. The guide system 30 guides the card module 20 within the housing 12. The card module 20 is guided such that the rear end connector 48 is mated to the header 22.

The heat sink flanges 140 extend at least partially into the chamber that receives the card module 20. In order to protect the TIM 150 on the heat sink flanges 140, the guide rail 32 includes the foil 152 over the TIM 150. The card module 20 slides along the foil 152 during loading and unloading of the card module 20 into the housing 12. In an exemplary embodiment, at the front end 104 of the guide rail 32, the heat sink flange 140 and/or the TIM 150 is chamfered or angled. The chamfered edge helps guide the card module 20 into the receiving space of the guide system 30. The chamfered edge also helps protect the TIM 150 from being wiped off of the outer edge 142 of the heat sink flange 140.

The card module 20 is loaded into the housing 12 until the rear end connector 48 is mated to the header 22. When fully assembled, the heat sink 52 is in thermal engagement with the guide rail 32 via the heat sink flanges 140 and/or the TIM 150. The sides 58, 60 engage the corresponding foils 152 and transfer heat across the interface therebetween. Heat generated by the card module 20 is dissipated by the heat sink 52 and is dissipated into the guide rail 32 for further heat dissipation. The heat dissipating fins 154, 156, 158 (shown in FIGS. 2-4) operate to dissipate the heat from the guide rail 32. Air is allowed to flow through the guide system 30 to dissipate heat from the guide rails 32. As such, the guide rails 32 operate to both guide the card module 20 into the guide system 30 as well as dissipate heat from the card module 20.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A guide system for an electronic device having a card module mated with a header, the guide system comprising:
   guide rails configured to guide the card module for mating with the header, the guide rails comprising:
   a main wall extending along a longitudinal axis between a front end and a rear end, the rear end configured to be positioned proximate to the header, the main wall having a side facing the card module;
   board guides extending from the side of the main wall, the board guides extending along the side parallel to the longitudinal axis, the board guides defining tracks configured to receive the card module to guide a rear end connector of the card module to the header; and
   heat sink flanges extending from the side of the main wall at a spaced apart location from the board guides, the heat sink flanges extending along the side parallel to the longitudinal axis, the heat sink flanges extending outward from the side of the main wall to engage a heat sink of the card module to dissipate heat from the heat sink of the card module to the main wall.

2. The guide system of claim 1, wherein the main wall includes a plurality of heat dissipating fins for dissipating heat from the guide rails.

3. The guide system of claim 1, wherein the heat sink flanges include an outer edge along a plane parallel to, and non-coplanar with, the side of the main wall, the heat sink flange includes a thermal interface material at the outer edge of the heat sink flanges, the thermal interface material for interfacing with the heat sink of the card module.

4. The guide system of claim 3, wherein the heat sink flanges include a foil over the thermal interface material for interfacing with the heat sink of the card module.

5. The guide system of claim 1, wherein the board guides are oriented to hold the card module in a horizontal orientation, the tracks extending along an edge of the card module for holding the card module in a horizontal direction and the track extending along the card module above and below the card module for holding the card module in a vertical direction, the heat sink flanges being vertically offset from the tracks with a section of the main wall between the board guides and the heat sink flanges to engage the corresponding heat sink above or below the card module.

6. The guide system of claim 1, wherein the side of the main wall defines a first side, the main wall includes a second side, the board guides extending from both the first side and the second side, the heat sink flanges extending from both the first side and the second side, the guide rails being configured to guide multiple card modules along both the first and second sides of the guide rails.

7. The guide system of claim 1, wherein the guide rails include a top end and a bottom end, the board guides extending from the main wall proximate to the top end and the bottom end with a section of the main wall positioned between the board guides proximate to the top end and the guide rails proximate to the bottom end, the heat sink flanges extending from the main wall proximate to the top end and the bottom end with a section of the main wall positioned between the board guides proximate to the top end and the heat sink flanges proximate to the top end to separate the heat sink flanges from the board guides proximate to the top end and with a section of the main wall positioned between the board guides proximate to the bottom end and the heat sink flanges proximate to the bottom end to separate the heat sink flanges from the board guides proximate to the bottom end, the guide rails being configured to guide multiple card modules along both the top end and the bottom end of the guide rails, the main wall being configured to hold the card modules apart from one another such that an air gap is formed between the card modules to dissipate heat from the guide rails.

8. The guide system of claim 1, wherein the guide rails include a top end and a bottom end, the main wall includes a central section having a plurality of fins for dissipating heat from the guide rails, the board guides including an upper board guide positioned between the central section and the top end and a lower board guide positioned between the central section and the bottom end, the heat sink flanges including an upper heat sink flange spaced apart from the upper board guide and positioned between the top end and the upper board guide and a lower heat sink flange spaced apart from the lower board guide and positioned between the bottom end and the lower board guide, the guide rails being configured to guide multiple card modules along both the top end and the bottom end of the guide rails, the main wall holding the card modules apart from one another such that an air gap is formed between the card modules aligned with the central section to dissipate heat from the guide rails.

9. The guide system of claim 1, further comprising a card module having a heat sink, the board guides of the guide rails engaging the card module, the heat sink flanges positioned relative to the board guides to directly engage the heat sink to dissipate heat from the heat sink.

10. A guide system comprising:
a guide rail configured to guide multiple card modules for mating with corresponding headers of an electronic device, the guide rail comprising:
a main wall extending along a longitudinal axis between a front end and a rear end, the rear end being positioned proximate to the header, the main wall having a first side and a second side;
board guides extending from the first and second sides of the main wall parallel to the longitudinal axis, the board guides defining tracks configured to receive corresponding card modules to guide the card modules to the corresponding headers; and
heat sink flanges extending from the first and second sides of the main wall parallel to the longitudinal axis at spaced apart locations from the board guides with sections of the main wall positioned between the heat sink flanges and the board guides, the heat sink flanges configured to engage heat sinks of the corresponding card modules to dissipate heat from the heat sinks to the main wall.

11. The guide system of claim 10, wherein the main wall includes a plurality of heat dissipating fins for dissipating heat from the guide rail.

12. The guide system of claim 10, wherein the heat sink flanges include outer edges extending along corresponding planes parallel to, and non-coplanar with, the first and second sides of the main wall, the heat sink flanges include a thermal interface material at the outer edge of the corresponding heat sink flange, the thermal interface material configured to draw heat from the heat sink of the card module to the heat sink flange.

13. The guide system of claim 12, wherein the heat sink flange includes a foil over the thermal interface material for drawing heat from the heat sink of the card module to the thermal interface material, the heat sink sliding along the foil during loading and unloading of the card module along the guide rail.

14. The guide system of claim 10, wherein each board guide is oriented to hold the corresponding card module in a horizontal orientation, the tracks extending along an edge of the card module for holding the card module in a horizontal direction and the tracks extending along the card module above and below the card module for holding the card module in a vertical direction, the heat sink flanges being vertically offset from the tracks with a section of the main wall between the board guides and the heat sink flanges to engage the corresponding heat sink above or below the card module.

15. The guide system of claim 10, wherein the guide rail includes a top end and a bottom end, the board guides extending from the main wall proximate to the top end and the bottom end, the heat sink flanges extending from the main wall proximate to the top end and the bottom end, the guide rail being configured to guide card modules along both the top end and the bottom end of the guide rail, the main wall holding the card modules apart from one another such that an air gap is formed between the card modules to dissipate heat from the guide rails.

16. An electronic device comprising;
a housing having a bezel with an opening therethrough;
a circuit board held in the housing spaced apart from the bezel, the circuit board having a header mounted thereto;
a card module received in the housing through the opening, the card module comprising a card module circuit board spanning between the bezel and the circuit board, the card module circuit board having a front end connector at a front end of the card module circuit board and a rear end connector at the rear end of the card module circuit board, the front end connector being exposed at the bezel for mating with a mating connector, the rear end connector being mated to the header, the card module comprising electronic components mounted to the card module circuit board, the card module comprising a heat sink dissipating heat from the electronic components; and
a guide rail guiding the card module for mating with the header, the guide rail comprising a main wall extending along a longitudinal axis between a front end and a rear end, the front end engaging the bezel, the rear end holding the circuit board proximate to the header, the guide rail comprising board guides extending from the main wall parallel to the longitudinal axis, the board guides engaging the card module to guide the rear end connector to the header, and the guide rail comprising heat sink flanges extending from the main wall parallel to the longitudinal axis, the heat sink flanges engaging the heat sink of the card module to dissipate heat from the heat sink to the main wall.

17. The electronic device of claim 16, wherein the main wall includes a plurality of heat dissipating fins for dissipating heat from the guide rail.

18. The electronic device of claim 16, wherein the heat sink flanges include a thermal interface material at an outer edge of the heat sink flanges, the thermal interface material configured to draw heat from the heat sink of the card module to the heat sink flange.

19. The electronic device of claim 18, wherein the heat sink flanges include a foil over the thermal interface material for drawing heat from the heat sink of the card module to the thermal interface material, the heat sink sliding along the foil during loading and unloading of the card module along the guide rail.

20. The electronic device of claim 16, wherein the main wall includes a first side and a second side, the board guides extending from both the first side and the second side, the heat sink flanges extending from both the first side and the second side, the guide rail being configured to guide multiple card modules along both the first and second sides of the guide rail.

21. The electronic device of claim 16, wherein the board guides include a track configured to receive the card module circuit board, the track holding the card module circuit board in a horizontal direction and a vertical direction.

* * * * *